United States Patent
Wu et al.

(10) Patent No.: US 7,489,190 B2
(45) Date of Patent: Feb. 10, 2009

(54) SWITCHING AUDIO POWER AMPLIFIER WITH DE-NOISE FUNCTION

(75) Inventors: Kuo-Hung Wu, Tainan County (TW); Po-Yu Li, Tainan County (TW)

(73) Assignee: Himax Analogic, Inc., Tainan County (TW)

( * ) Notice: Subject to any disclaimer, the term of this patent is extended or adjusted under 35 U.S.C. 154(b) by 0 days.

(21) Appl. No.: 11/775,880

(22) Filed: Jul. 11, 2007

(65) Prior Publication Data

US 2009/0015327 A1    Jan. 15, 2009

(51) Int. Cl.
*H03F 3/38* (2006.01)
(52) U.S. Cl. .................................. 330/10; 330/251
(58) Field of Classification Search .................. 330/10, 330/207 A, 251
See application file for complete search history.

(56) References Cited

U.S. PATENT DOCUMENTS

| | | | |
|---|---|---|---|
| 6,998,911 B2* | 2/2006 | Honda et al. | 330/10 |
| 7,315,202 B2* | 1/2008 | Tsuji | 330/10 |
| 7,332,962 B2* | 2/2008 | Wu et al. | 330/251 |

* cited by examiner

*Primary Examiner*—Henry K Choe
(74) *Attorney, Agent, or Firm*—Jianq Chyun IP Office

(57) ABSTRACT

The invention provides a switching audio power amplifier with de-noise function including a pulse width modulator, a de-noise circuit and a bridge circuit. The pulse width modulator performs pulse width moderation to generate the first and second PWM signals according to an input audio signal. The de-noise circuit receives the first and second PWM signals. And the bridge circuit conducts a driving current alternately flowing to and from a load according to the control signals output from the de-noise circuit.

13 Claims, 12 Drawing Sheets

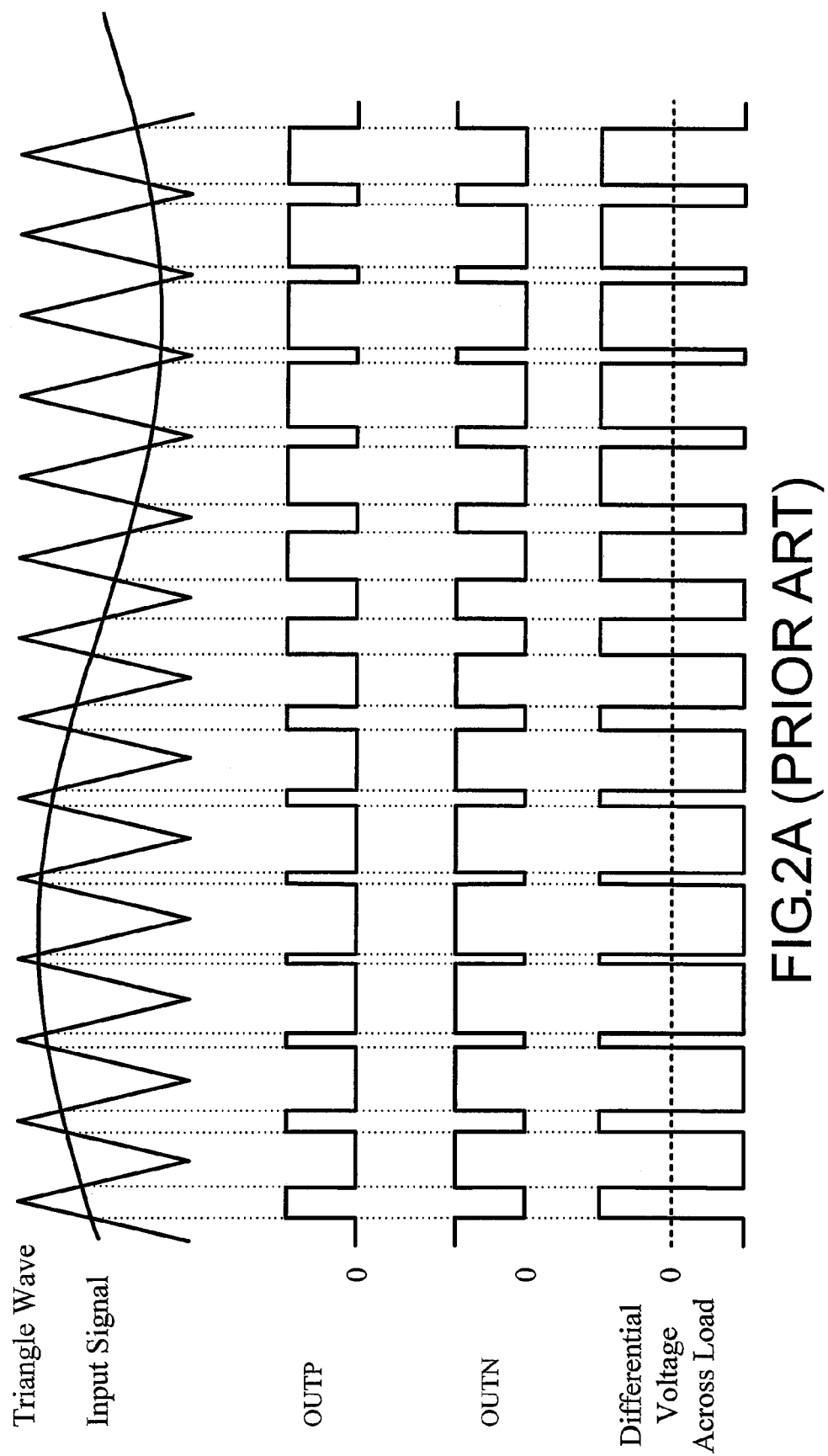

SWITCHING AUDIO POWER AMPLIFIER WITH DE-NOISE FUNCTION

BACKGROUND OF THE INVENTION

1. Field of Invention

The present invention relates to circuit structure of an audio power amplifier, more specifically, relates to a structure of a circuit of a switching audio power amplifier with de-noise function.

2. Description of Related Art

Since the evolution of the amplifier from a vacuum tube to a transistor, noise interference has always been the biggest problem that audio power amplifier has ever faced. At present, the efficiency of the commonly used Class D Audio Power Amplifier (called class D amplifier hereinafter) is two to five times higher than the Class AB Audio Power Amplifier. Because of its higher efficiency, class D amplifier only requires less power and can reduce the power consumption of a whole system, therefore the cost, size and weight of a system can be significantly reduced.

Class D amplifier converts audio signals into high frequency pulses and switches and outputs the same according to the audio input signals. Some of class D amplifiers use pulse width modulator to generate constant pulses whose width varies with the amplitude of audio signals. Pulses with changing width switch output transistor at a fix frequency.

Theoretically, a class D amplifier would not output sound when there is no signal input. However, in fact class D amplifier still may amplify the previous step signals. If the noise floor of the previous step IC (Integrated Circuit) is too large, class D amplifier may consider the noise as signals to amplify and output to a speaker, therefore human ears may hear the noise of very low energy. Therefore the energy of the noise floor has to be blocked off with circuit design to improve the SNR (signal to noise ratio) and noise floor performance of a system.

The source of noise can be classified into external noise and noise floor of IC itself, the former for example is power supply hum. This is because the class D amplifier uses transistor switch to drain large current from power supply end, but fails to effectively filter the power supply end. Therefore, when the gate signal of the transistor switch is triggered to demand for a pure clean large current to pass through the power supply end, the large current itself contains noise signals instead of pure clean current, therefore the noise may be fed back to the system itself through a feedback circuit.

Another common external noise interference is RFI (radio frequency interference). When RF (radio frequency) signals are close to an audio amplifier, the common-mode configuration of the transistor switch may receive RF signals as well and becomes the noise interference of the audio amplifier itself due to antenna effect. For example the Hum noise when a cell phone is close to a speaker.

A common practice of eliminating external noise is to apply a low pass filter on the input end to filter the noise mixed in the input signals, so that a load (for example a speaker) does not output noise due to noise signal. Or add a low pass filter circuit in a feedback circuit to eliminate power supply hum noise and to avoid noise being feed back from the feedback circuit. Common-mode input can also be used to drive the load, so as to use high common-mode rejection ratio to counteract the RF interference. Or add a relatively low noise input step in previous step, and then reduce the noise which is output from the present step using a feedback method.

The noise floor of IC itself is an internal spontaneous phenomenon which includes flicker noise, thermal noise and shot noise and etc. The flicker noise is a result of that during the fabrication process of CMOS, the stray capacitor captures electrons and releases electrons with an energy levels method. Thermal noise is a thermal fluctuation phenomenon, which occurs when the IC internal electrons flow through a current pass. Shot noise is the shooting noise (like the whistle sound of BBs of BB gun), which occurs when electrons pass through transistor potential steps. All these are parameters having been determined during the fabricating process of silicon wafers. Therefore, even if there is no audio signal input, but the input end of class D amplifier receives the noise floor of previous step and amplifies it, so very low energy noise at a load end (for example a speaker) can be heard by human ears. Therefore, when there is no audio signal input, after the noise floor received by class D amplifier is amplified, the performances of SNR and noise floor get worse. FIG. 1 shows a known class D amplifier. The input audio signals are input into an input amplifier 101 through capacitors CIN1 and CIN2. Then the comparator 105 compares the amplifier 101's output value received at the negative input end and a triangle wave generator 103's triangle wave reference signals received at the positive end, so as to generate PWM (pulse width modulation) signals. The PWM signals are input to a gate driver 107 to drive the transistors 11~Q14. The differential outputs OUTP and OUTN of class D amplifier pass through a low pass filter (including L1/C1 and L2/C2) respectively, the latter converts the pulses back to audio amplifying signals to drive a load or a plurality of loads 109 (for example audio speaker).

The differential output OUTP and OUTN of known class D amplifier are complementary, the signal shift range is from ground to VDD. FIG. 2A~FIG. 2C respectively show the wave forms of large input signals, small input signals and the wave form when no signal is input. In FIG. 2C, a high output ripple current is generated. As shown in FIG. 1, a large LC filter is required in order to reduce the rippled current. In the existing technology, since LC filter is required to eliminate noise signals, therefore the size of the whole circuit may be relatively large.

SUMMARY OF THE INVENTION

The present invention provides a switching audio amplifier with a de-noise function to solve the noise problem caused by the noise signal in the prior art.

The present invention provides a switching audio amplifier with de-noise function, including a PWM, a de-noise circuit and a bridge circuit. The PWM modulates the pulse width according to an input audio signal to generate a first PWM signal (pulse width modulating signal) and a second PWM signal for the de-noise circuit. When the phase difference between the second PWM signal and the first PWM signal is less than a threshold, the de-noise circuit delays the second PWM signal to increase the phase difference. Then the bridge circuit conducts a driving current alternately flowing to and from a load according to the first PWM signal and the delayed second PWM signal.

The present invention provides another switching audio amplifier with de-noise function, which includes a first comparator, a second comparator, a logic control unit, a de-noise circuit and a bridge circuit. The first comparator and the second comparator respectively generate the first PWM signal and the second PWM signal, and then the logic control unit performs logic operation to generate a third PWM signal and a fourth PWM signal. At this moment, if the pulse width of the third PWM signal (or the fourth PWM signal) is lower than a threshold, then the de-noise circuit increases the pulse width of the third PWM signal (or the fourth PWM signal), and outputs the fifth PWM signal and the sixth PWM signal to drive the bridge circuit. Next, the bridge circuit conducts a driving current alternately flowing to and from a load according to the firth PWM signal and the sixth PWM signal.

Since the present invention uses a filter-less circuit structure, therefore the present invention has the advantage of filter-less and reduced size, and the noise generated by common-mode noise, power supply hum, radio frequency interference and noise floor may be eliminated.

In order to the make the aforementioned and other objects, features and advantages of the present invention comprehensible, a preferred embodiment accompanied with figures is described in detail below.

BRIEF DESCRIPTION OF THE DRAWINGS

FIG. 2A~2C are signal wave form diagrams of a conventional class D audio amplifier.

DESCRIPTION OF EMBODIMENTS

The First Embodiment

Figure 1:
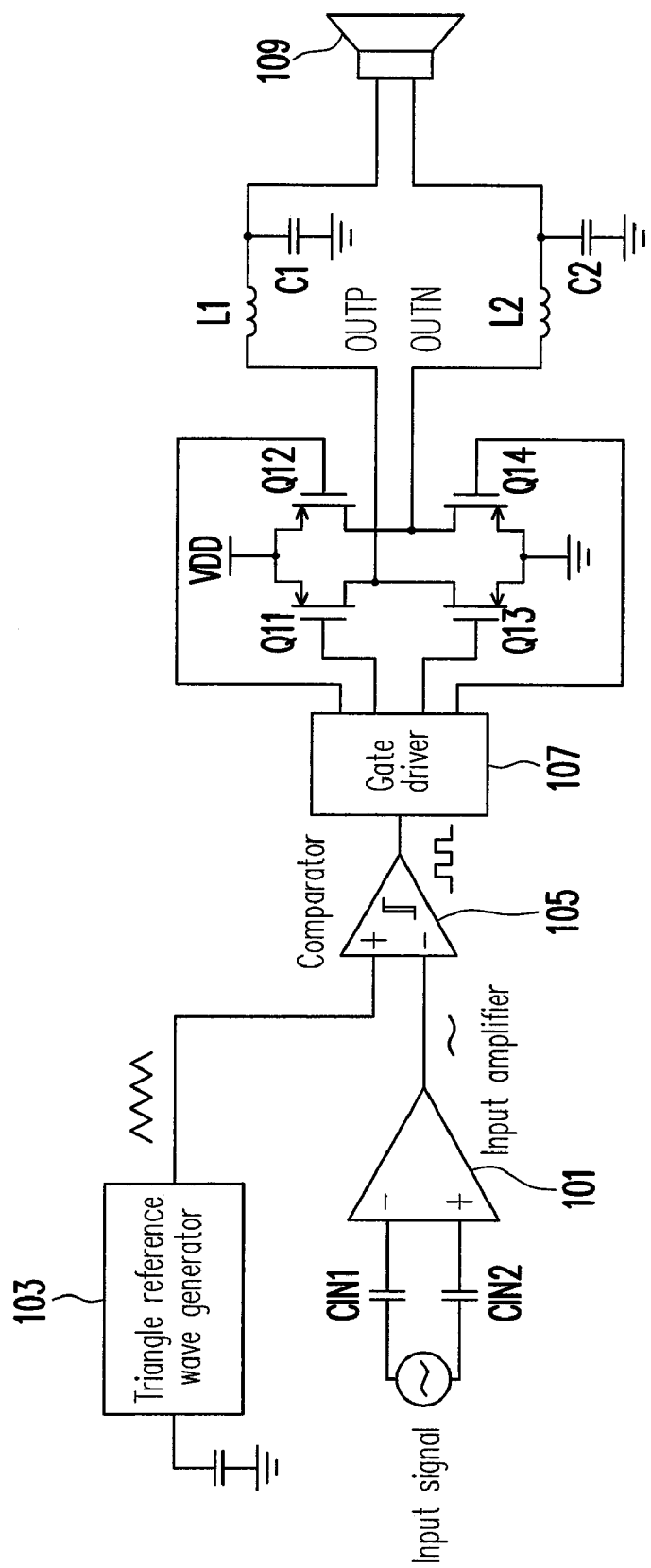
FIG. 1 is a schematic diagram of a conventional class D audio amplifier.
Figure 2B:
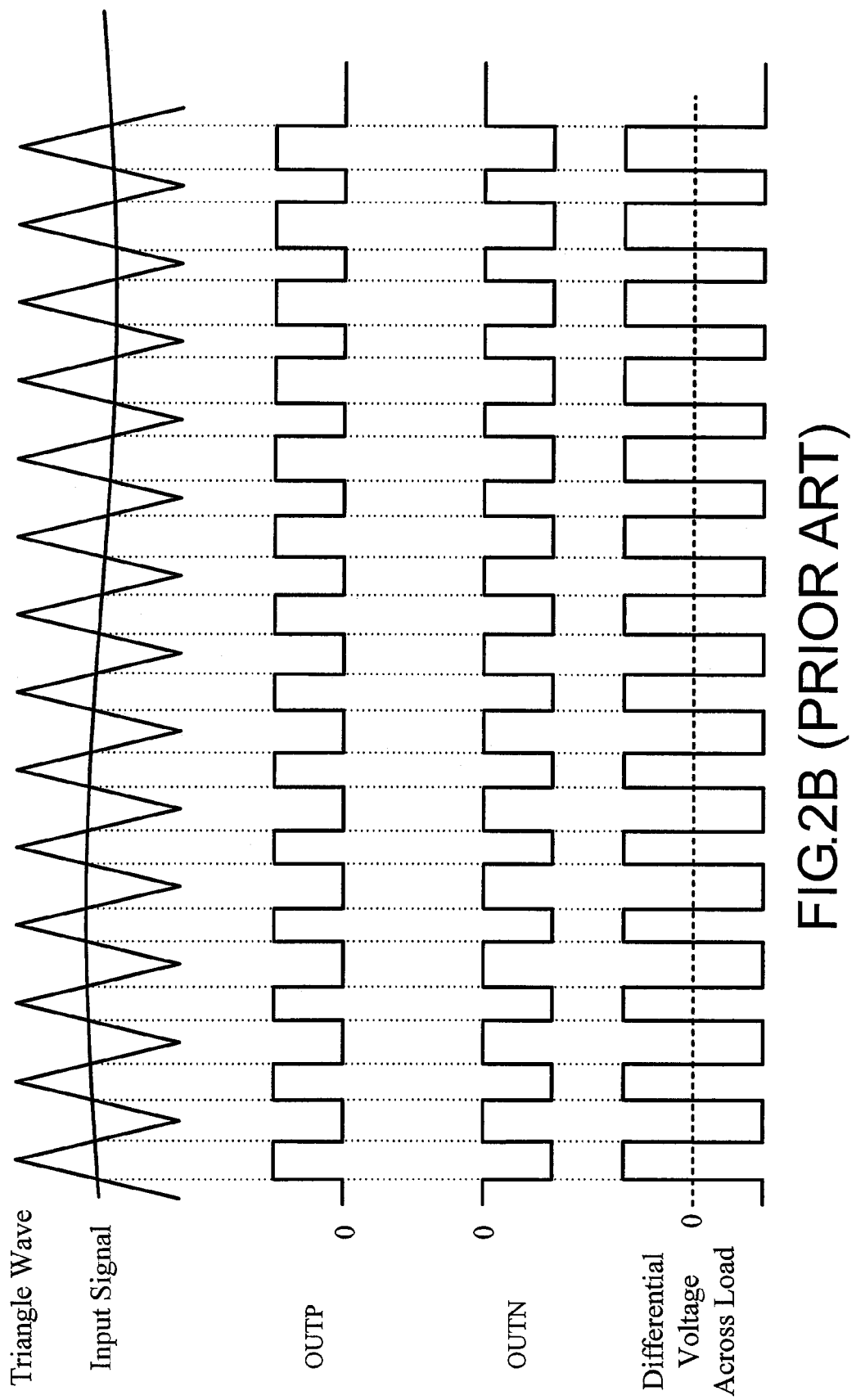
Figure 2C:
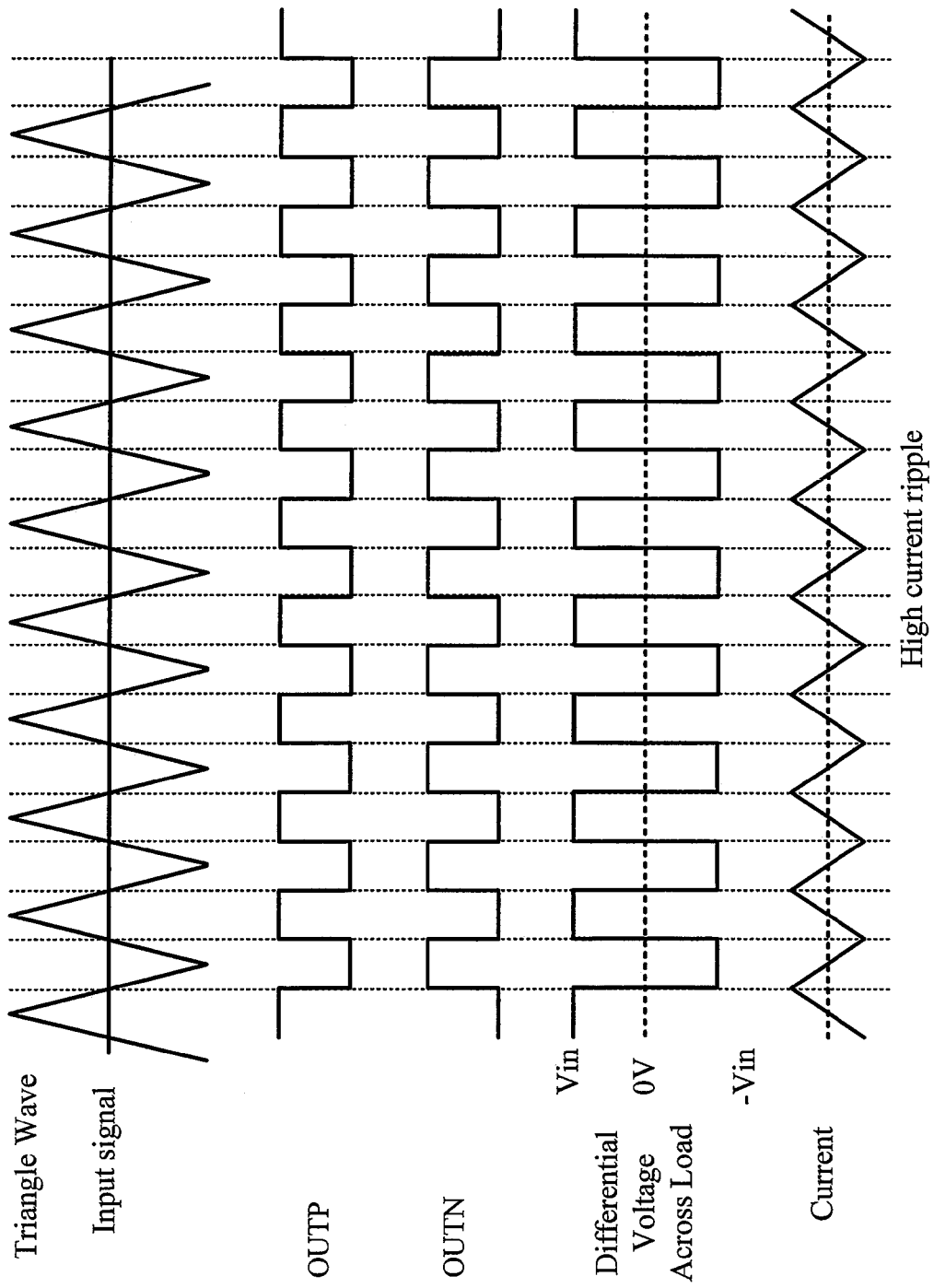
Figure 3:
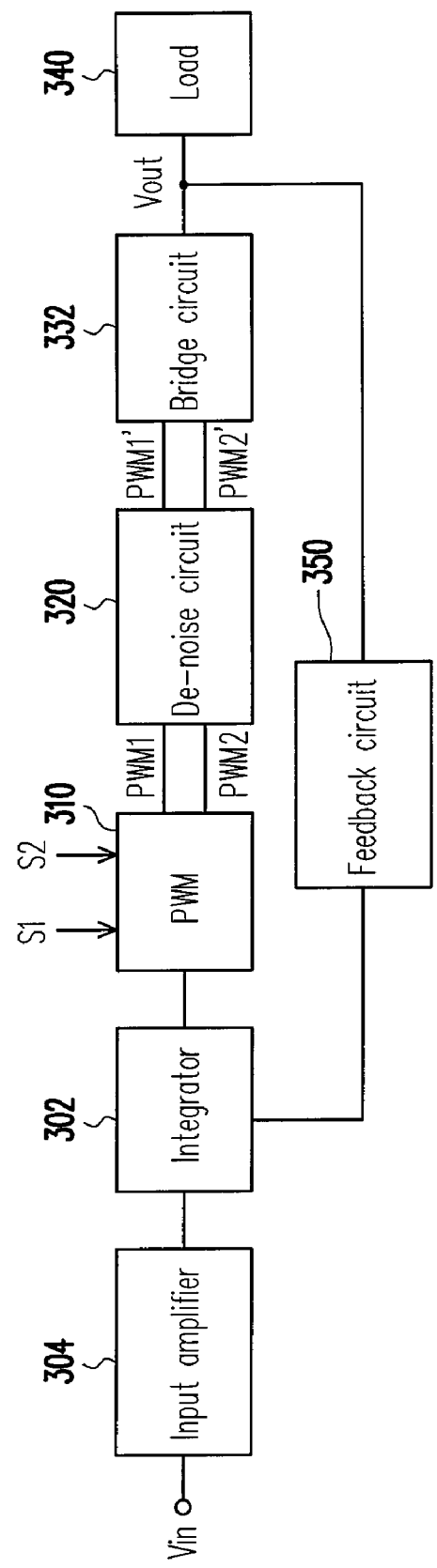
FIG. 3 is a block diagram of a switching audio power amplifier according to a first embodiment of the present invention.

FIG. 3 illustrates a block diagram of a switching audio power amplifier with de-noise function according to the first embodiment of the present invention. The switching audio power amplifier includes an input amplifier 304, an integrator 302, a pulse width modulator 310, a de-noise circuit 320, a bridge circuit 332 and a feedback circuit 350. To describe the present invention in more detail, a load 340 is also shown in FIG. 3.

Figure 4:
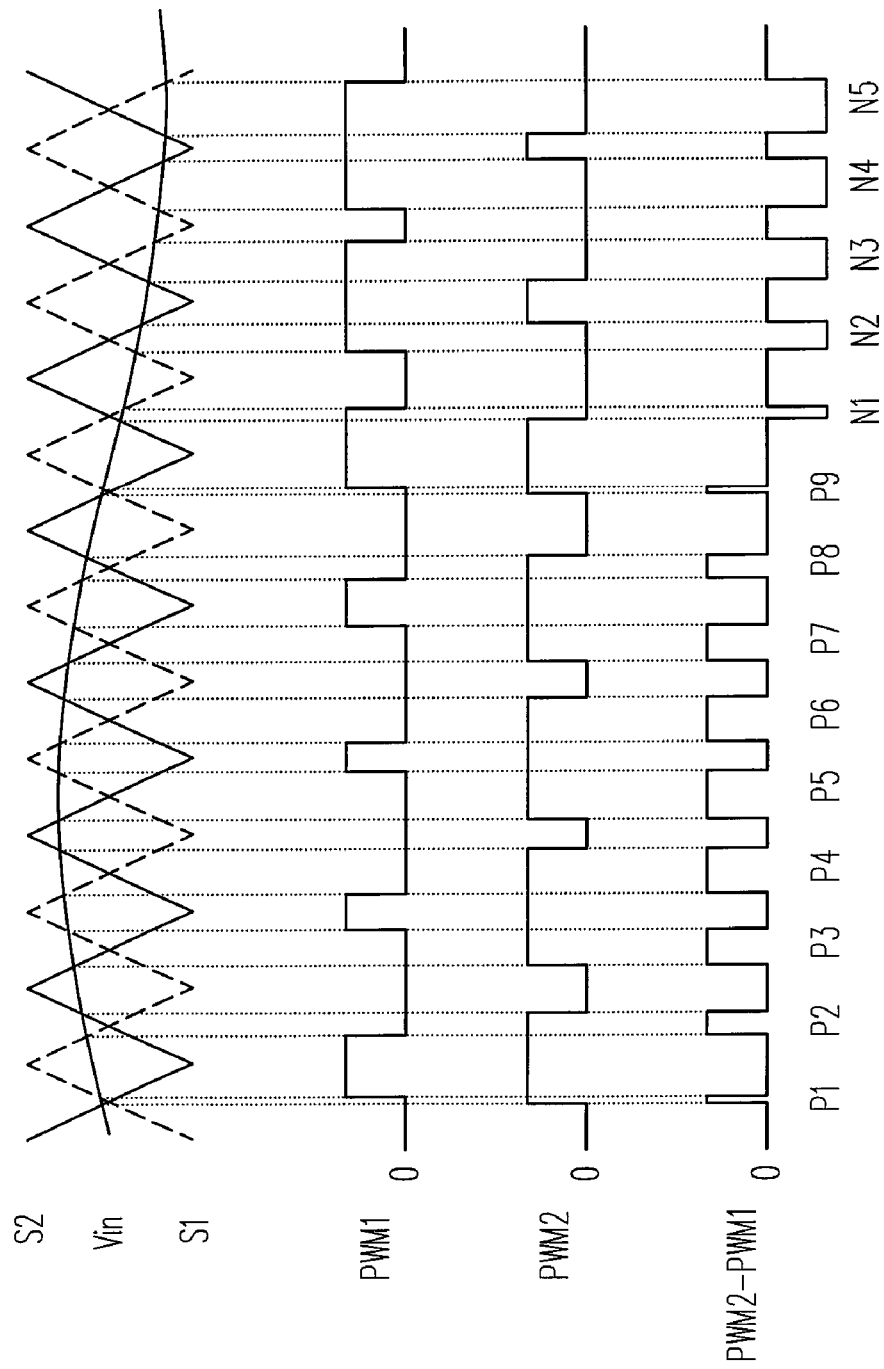
FIG. 4 is a signal wave form diagram a switching audio power amplifier according to the first embodiment of the present invention.

The pulse width modulator 310 shown in FIG. 3 is a dual reference signal pulse width modulator 310. In the present embodiment, the wave form of reference signals S1 and S2 may be saw tooth wave (as shown in FIG. 4). Referring to FIG. 3 and FIG. 4, the input amplifier 304 amplifies an input audio signal Vin. The integrator 302 performs an integral operation to the amplified audio signal Vin and the feedback signal output by the feedback circuit 350. The pulse width modulator 310 generates the first PWM signal PWM1 and a second PWM signal PWM2 according to the dual reference signals S1 and S2 and the integral operated input audio signal Vin. Next, the de-noise circuit 320 increases the phase difference between the first PWM signal PWM1 and the second PWM PWM2 to a value greater than a threshold, then inputs the processed first PWM signal PWM1' and second PWM signal PWM2' to the bridge circuit 332. The bridge circuit 332 is controlled by the output signals PWM1' and PWM2' to generate a driving signal Vout for the load (for example a speaker), whereby a driving current alternately flows to and from the load. The feedback circuit 350 generates feedback signals to the integrator 302 according to the driving signal Vout output by the bridge circuit 332. Thus, the pulse widths of the first PWM signal PWM1 and the second PWM signal PWM2 may be modulated according to the feedback signals.

Figure 5:
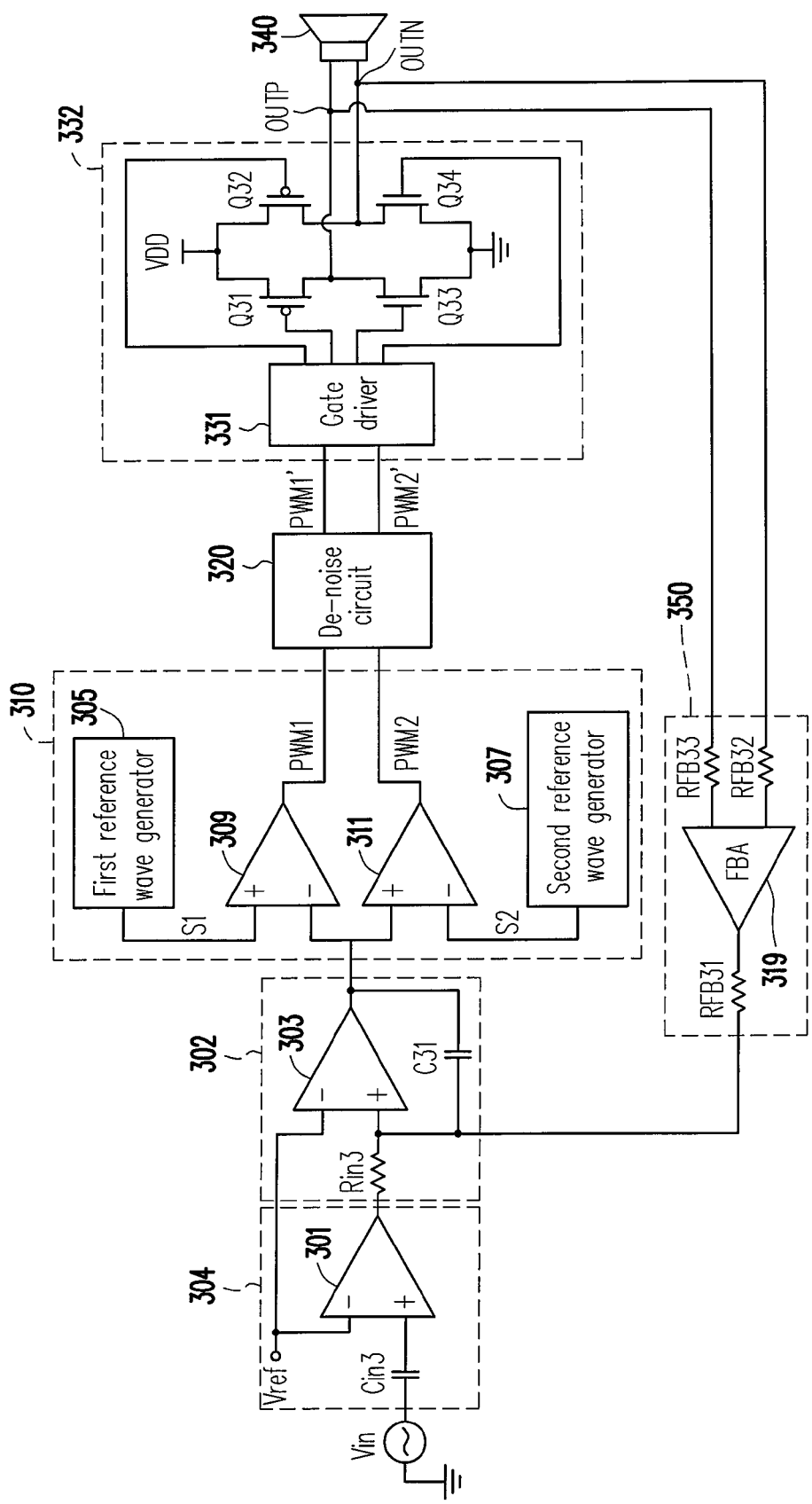
FIG. 5 is a circuit diagram of a switching audio power amplifier according to the first embodiment of the present invention.

FIG. 5 is a circuit diagram of the switching audio power amplifier according to the first embodiment of the present invention, which includes an input amplifier 304, an integrator 302, a pulse width modulator 310, a de-noise circuit 320, a bridge circuit 332 and a feedback circuit 350. The coupling relationship thereof is clearly as shown in FIG. 5. The input amplifier 304 includes a capacitor Cin3 and a first operation amplifier 301. The capacitor Cin3 filters the DC carrier wave of the audio signals Vin. The positive input end of the operation amplifier 301 receives the audio signals Vin filtered by the capacitor Cin3, and the negative end thereof receives a reference voltage Vref. The operation amplifier 301 passes the amplified audio signals to the integrator 302.

The feedback circuit 350 includes a first feedback resistor RFB32, a second feedback resistor RFB33, a third feedback resistor RFB31 and an operation amplifier 319. The first ends of the feedback resistors RFB32 and RFB33 are respectively coupled to the first end and the second end of the load 340. The positive and negative ends of the operation amplifier 319 are respectively coupled to the second ends of the feedback resistor RFB32 and RFB33. The first end of the third feedback resistor RFB31 is coupled to the output end of the operation amplifier 319, and the second end of the third feedback resistor RFB31 is used to output feedback signals to the positive input end of the operation amplifier 303 in the integrator 302.

The integrator 302 includes a resistor Rin3, the operation amplifier 303 and a capacitor C31. The first end and the second end of the resistor Rin3 are respectively coupled to the output end of the operation amplifier 301 and the positive input end of the operation amplifier 303. The negative input end of the operation amplifier 303 receives the reference voltage Vref. The output end of the operation amplifier 303 is coupled to the first comparator 309 and the second comparator 311 of the pulse width modulator 310. The first end and the second end of the capacitor C31 are respectively coupled to the positive input end and the output end of the operation amplifier 303.

In the pulse width modulator 310, the first comparator 309 compares the output level (equivalent to the audio signal Vin) of the operational amplifier 303 with the output level (i.e. the first reference signal S1) of a first reference signal generator 305 to output the first PWM signal PWM1; the second comparator 311 compares the output level (equivalent to the audio signal Vin) of the operational amplifier 303 with the output level (i.e. the second reference signal S1) of a second reference signal generator 307 to output the second PWM signal PWM2. As shown in FIG. 4, when the first reference signal S1 is greater than the input audio signal Vin, the first PWM signal PWM1 is transformed into high level; when the input audio signal Vin is greater than the second reference signal S2, the second PWM signal PWM2 is transformed into high level.

The de-noise circuit 320 checks the phase difference between the signals PWM1 and PWM2 to determine whether it is larger than a threshold. If the phase difference between the signals PWM1 and PWM2 is smaller than a threshold, then the de-noise circuit 320 delays the phase of the phase lag one (for example the second PWM signal PWM2) in the PWM signals PWM1 and PWM2 to output the processed first PWM signal PWM1' and the second PWM signal PWM2'. Of course, the present invention may also let the de-noise circuit 320 promote the phase of the phase lead one (for example the first PWM signal PWM1) to achieve the same effect. Then the de-noise circuit 320 passes the processed first PWM signal PWM1' and the second PWM signal PWM2' to the bridge circuit 332.

The bridge circuit 332 includes a gate driver 331, a first switch, a second switch, a third switch and a fourth switch. The gate driver 331 drives the first to fourth switches according to the received PWM signals PWM1 and PWM2. In the present embodiment, the first switch and the second switch, for example, is implemented with PMOS transistors Q31 and Q32, and the third and the fourth switches may be implemented with NMOS transistors Q33 and Q34. The transistor Q31 and the transistor Q33 determine ON/OFF state according to the PWM signal PWM1'. For example, when the PWM signal PWM1' is at a high level, the transistor Q31 is turned off and the transistor Q33 is turned on. The transistor Q32 and the transistor Q34 determine ON/OFF state according to the PWM signal PWM2'. For example, when the PWM signal PWM2' is at a high level, the transistor Q32 is turned off and the transistor Q34 is turned on.

Referring to FIG. 4 and FIG. 5, when the first PWM signal PWM1 is at a logic high potential and the second PWM signal PWM2 is at a logic low potential, the gate driver 331 turn on the transistor Q32 and transistor Q33 and turn off the transistor Q31 and the transistor Q34. At this time, current may flow through the transistor Q32, the load 340 and the transistor Q33 and then to ground. On the contrary, when the first PWM signal PWM1 is at a logic low potential and the second PWM signal PWM2 is at a logic high potential, the gate driver 331 may turn on the transistor Q31 and transistor Q34 and turn off the transistor Q32 and the transistor Q33. At this time, current may flow through the transistor Q31, the load 340 and the transistor Q34 and then to ground. If the first PWM signal PWM1 and the second PWM signal PWM2 both are at a high potential or a low potential at the same time, since the voltages on both sides of the load 340 are in balance, no current flows through the load 340. Therefore, the driving signal Vout (i.e. the signal OUTP and OUTN in FIG. 5) output by the bridge circuit 332 is equivalent to the second PWM signal PWM2 less the first PWM signal PWM1.

Next, the actuation principle of the load 340 will explained. It can be seen from FIG. 4, the elements of PWM2-PWM1 (equivalent to the driving signal Vout) include a plurality of pulse waves P1~P9 representing positive direction and a plurality of pulse waves N1~N5 representing negative direction. When these pulse waves apply on the load 340 (for example a speaker), the positive pulse waves P1~P9 will accumulate energy to expand the speaker towards positive direction. Similarly, the negative pulse waves N1~N5 will also accumulate energy so that the speaker expands towards negative direction. Sound is formed when the speaker vibrates back and forth in different directions. One worth noticing is that the behaviors of accumulating energy on the speaker are all completed within a plurality of reference signals. More reference signals required to complete one positive direction (or negative direction) energy accumulation indicates the lower the frequency of sound, and the lower the sound. On the contrary, if only a small amount of reference signals required to complete once positive direction (negative direction) energy accumulation, the speaker vibrates at a higher frequency in a unit time, and the frequency of the sound is higher.

Figure 6:
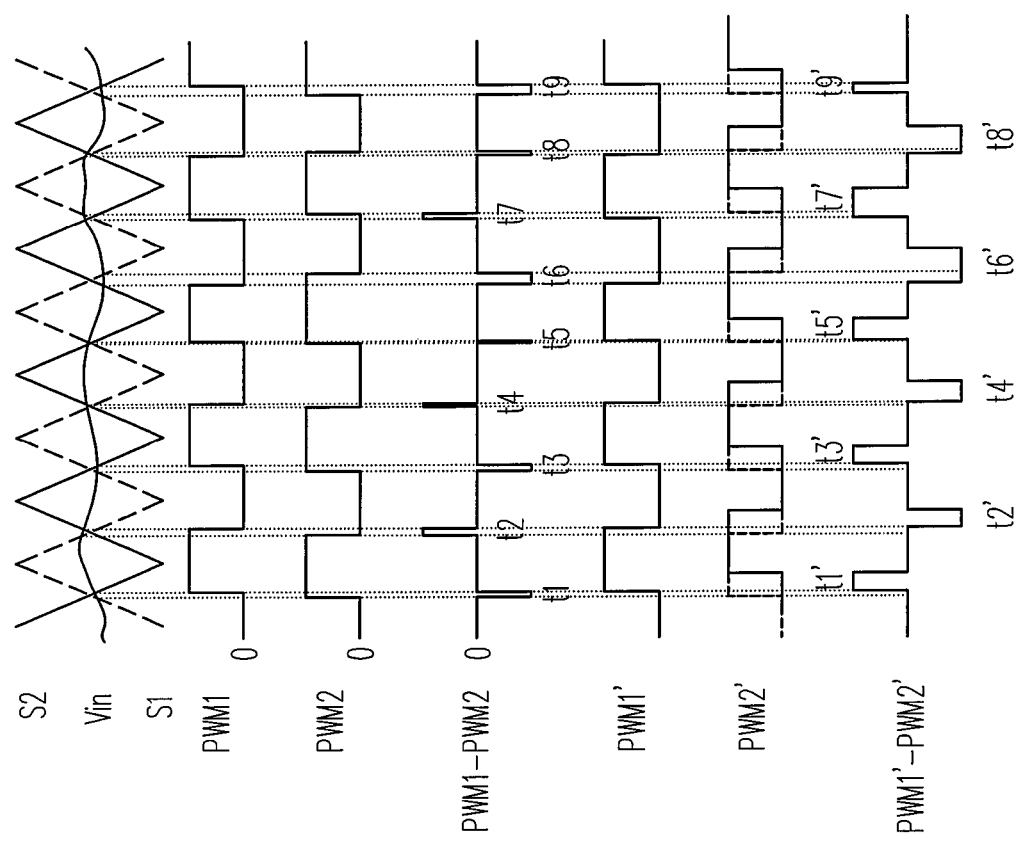
FIG. 6 is a signal wave form diagram a switching audio power amplifier according to the first embodiment of the present invention.

Next, the present embodiment will describe the operating principle of the de-noise circuit 320 with reference to FIG. 5 and FIG. 6. First, the formation of noise is described with reference to FIG. 6. When there is no audio signal Vin input at the input end the switching audio power amplifier, ideally the output end thereof shouldn't have driving signal Vout (i.e. the PWM1-PWM2 shouldn't have pulse). However, due to the noise signal interference from outside and the noise floor of the system itself, therefore the input audio signal Vin may generate slight noise (as shown in FIG. 6).

Without the de-noise circuit 320, the audio power amplifier may perform pulse width modulation considering the noise as the normal input audio signals to form the driving signal Vout (i.e. the signals OUTP and OUTN, equivalent to PWM1-PWM2). The elements of the driving signal Vout are pulses t1~t9. It is seen from FIG. 6, the pulse t1 and pulse t2 are within one reference signal time, so the speaker is vibrated back and forth once. More specifically, that is to say the pulse t1 provides energy proportional to the pulse width thereof, so that the vibration membrane of the speaker expands towards the inverse direction. Then the pulse t2 further provides energy proportional to the pulse width thereof, so that the vibration membrane of the speaker expands towards the positive direction. Since the vibration membrane completes one back and forth vibration within a reference signal time, therefore the speaker produces a high frequency sound that can not be heard by human ears. Next referring to the pulses t5~t9 in FIG. 6, as described above, the vibration membrane completes one back and forth vibration within a plurality of reference signals time, therefore the speaker produces the noise that can be picked up by human ears.

After the noise signal imitates the input audio signal Vin and enters the pulse width modulator 310, the first PWM signal PWM1 and the second PWM signal PWM2 are generated. Since the audio power amplifier of FIG. 5 has the de-noise circuit 320, at this moment the de-noise circuit 320 may check the phase difference between the first PWM signal PWM1 and the second PWM signal PWM2. If the phase difference between the first PWM signal PWM1 and the second PWM signal PWM2 is greater than a threshold, at this moment the de-noise circuit 320 will not adjust the phase of the signal-PWM1 and the signal PWM2, instead, the de-noise circuit 320 outputs the signal PWM1 and the signal PWM2 as the signal PWM1' and PWM2' to the bridge circuit 332. When the phase difference between the signal PWM1 and the signal PWM2 is less than a threshold, the de-noise circuit 320 will increase the phase difference between the first PWM signal PWM1 and the second PWM signal PWM2 to a value greater than a threshold, then output the processed first PWM signal PWM1' and the second PWM signal PWM2' to the bridge circuit 332. For example the phase of the second PWM signal PWM2 is delayed to form the delayed second PWM signal PWM2' (as shown in FIG. 6). Of course the phase of the first PWM signal PWM1 may also be promoted to achieve the same effect. Therefore the driving signals Vout (i.e. the signals OUTP and OUTN in FIG. 5, equivalent to PWM1'-PWM2') are then modulated to pulses t1'~t9'. It can be known from FIG. 6, at this moment, the PWM1'-PWM2' both became positive, negative pulse alternating signals, therefore the energy that pulses t1'~t9' accumulated for the load 340 is fully released within a reference signal time (equivalent to high frequency), therefore the effect of averaging noise is achieved. The positive and negative pulses and alternating signals PWM1'-PWM2' are fed back to the integrator 302 via the feedback circuit 350, so that the switching audio power amplifier creates a self-regulating function, and therefore the outputs thereof tend to be stable after a plurality of cycles.

Figure 7:
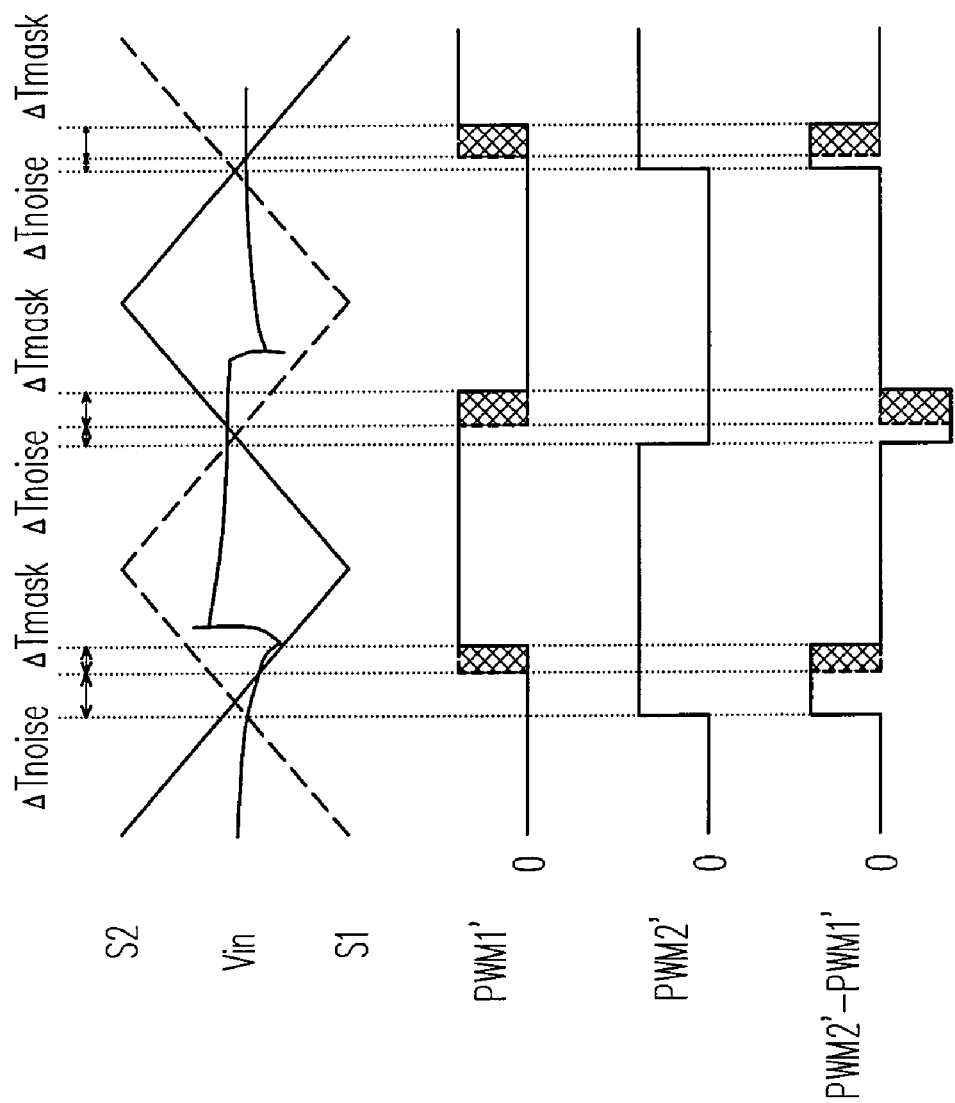
FIG. 7 is a signal wave form diagram a switching audio power amplifier according to a second embodiment of the present invention.

In other words, referring to FIG. 7, in terms of the time order of signals, the de-noise circuit 320 appends a noise mask ΔTmask at the end of each noise pulse ΔTnoise of the signals PWM2'-PWM1'. In addition, the pulse width of the noise mask ΔTmask has to be larger than that of the noise pulse ΔTnoise. If the noise mask ΔTmask and the noise pulse ΔTnoise are phase inverse, then the new noise pulse is the noise mask ΔTmask less the noise pulse ΔTnoise. Therefore the directions of the revised pulse width signals (as t1'~t9' shown in FIG. 6) has to be alternations of positive and negative pluses, that is, in the same direction with the noise mask. Since the audio power amplifier is a negative feedback structure, therefore the positive and negative alternating pulse width signals may force the feedback circuit 350 to actuate, so that audio power amplifier may output positive, negative pulses alternately in every reference signal cycle.

To sum up, the present embodiment converts noise signals into the pulse width signals of positive and negative alternating pulses, and these pulse width signals have the alternations of positive and negative pulses in each of the reference signal cycles, therefore even if the load end is capable of quickly responding to the changes of the pulse width signals, the output thereof may also be high frequency signals which cannot be heard by human ears.

The Second Embodiment

Figure 8:
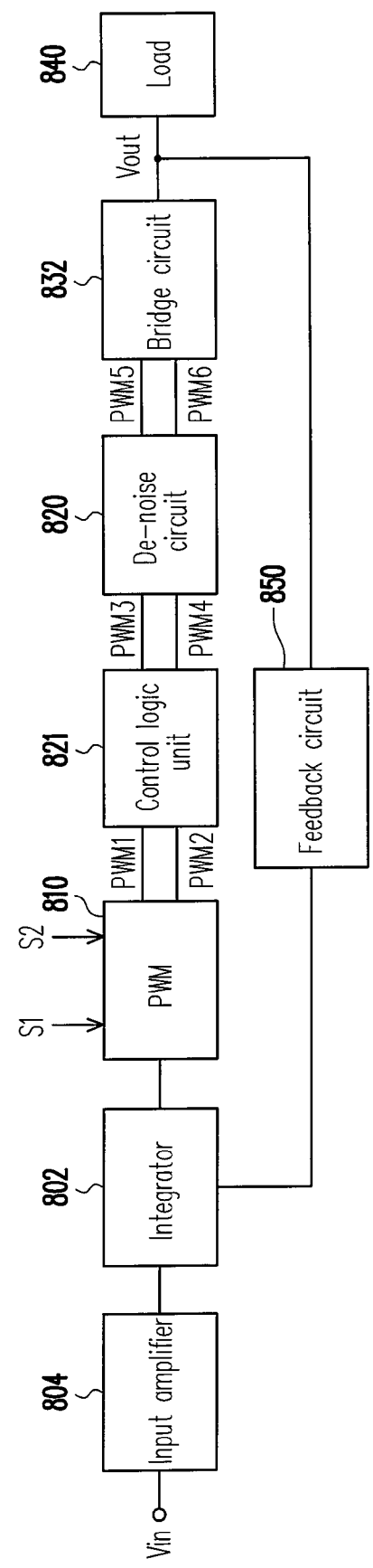
FIG. 8 is a block diagram of a switching audio power amplifier according to the second embodiment of the present invention.

FIG. 8 is a block diagram of a switching audio power amplifier with the de-noise function according to a second embodiment of the present embodiment. The switching audio power amplifier includes an amplifier 804, an integrator 802, a pulse width modulator 810, a control logic unit 821, a de-noise circuit 820, a bridge circuit 832 and a feedback circuit 850. The audio power amplifier of the present embodiment is used to drive the load 840 (such as a speaker and etc). The feedback circuit 850 generates feedback signals to the integrator 802 according to the driving signal Vout output to the load 840 by the bridge circuit 832.

Figure 9:
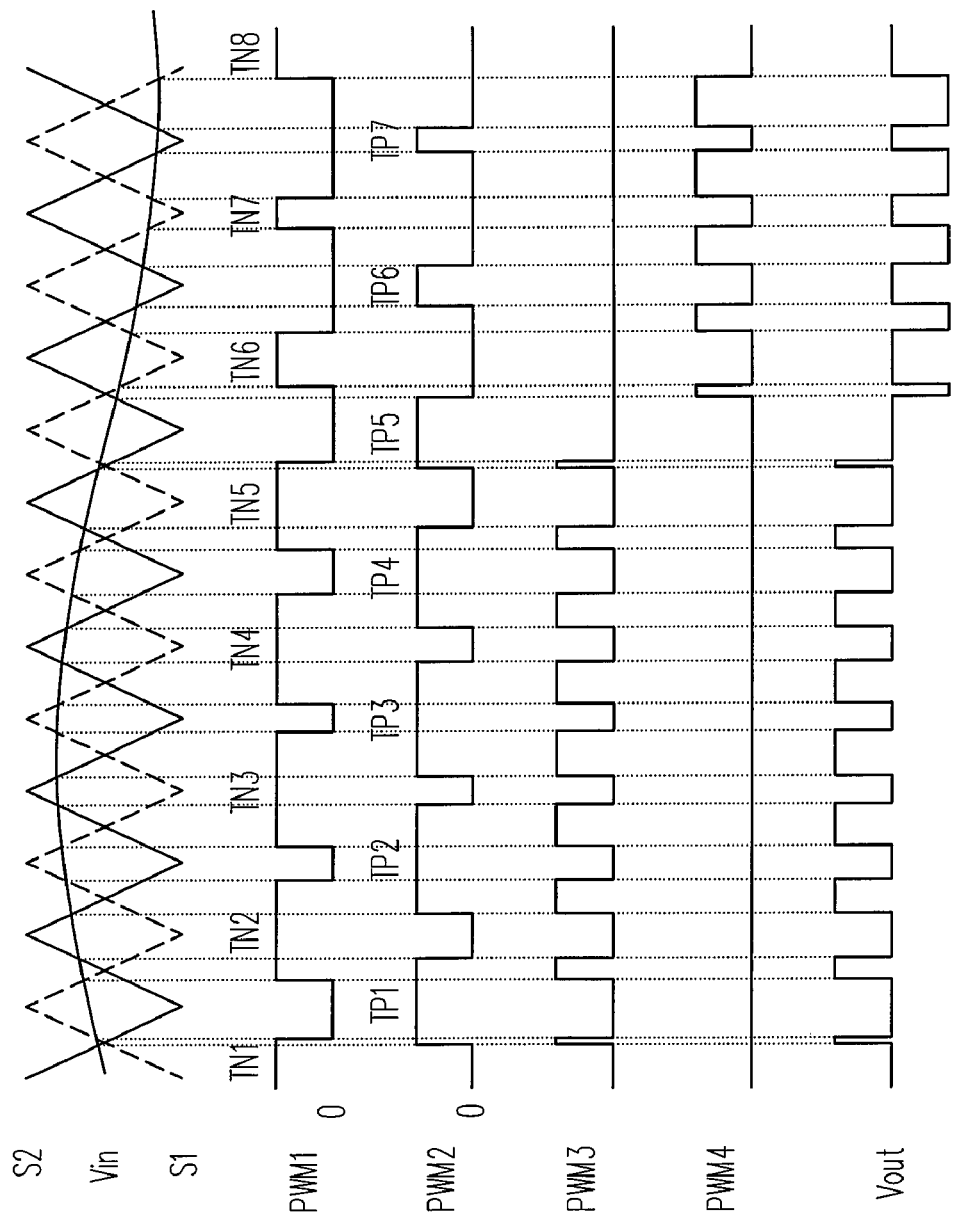
FIG. 9 is a signal wave form diagram a switching audio power amplifier according to the second embodiment of the present invention.

The audio power amplifier 804 amplifies the input audio signal Vin. The integrator 802 performs an integral operation to the amplified audio signal Vin and the feedback signal output by the feedback circuit 850. The pulse width modulator 810 is a dual reference signals pulse width modulator. In the present embodiment, the wave form of the reference signals S1 and S2 may be saw tooth wave (as shown in FIG. 9). The pulse width modulator 810 generates the first PWM signal PWM1 and the second PWM signal PWM2 according to the dual reference signals S1 and S2 and the integrally operated input audio signal Vin. Referring to FIG. 8 and FIG. 9, when the level of the input audio signal Vin is greater than the level of the first reference signal S1, the first PWM signal PWM1 is then transformed to high level (for example as the pulses TN1~TN8 shown in FIG. 9). Similarly, when the level of the input audio signal Vin is greater than the level of the second reference signal S2, the second PWM signal PWM2 is then transformed to high level (for example as the pulses TP1~TP7 shown in FIG. 9). The control logic unit 821 performs AND operation to the received first PWM signal PWM1 and the second PWM signal PWM2 to generate the third PWM signal PWM3. In addition, the control logic unit 821 performs NOR operation to the first PWM signal PWM1 and the second PWM signal PWM2 to generate the fourth PWM signal PWM4.

The de-noise circuit 820 may check the pulse width of the received third PWM signal PWM3 and the fourth PWM signal PWM4. When the pulse width of the third PWM signal PWM3 is smaller than a threshold, the de-noise circuit 820 may increase the pulse width of the third PWM signal PWM3 to output as the fifth PWM signal PWM5. Similarly, when the pulse width of the fourth PWM signal PWM4 is smaller than a threshold, the de-noise circuit 820 may also increase the pulse width of the fourth PWM signal PWM4 to output as the sixth PWM signal PWM6.

The bridge circuit 832 then drives the load 840 according to the control of the fifth PWM signal PWM5 and the sixth PWM signal PWM6. Finally, the feedback circuit 850 then generates a feedback signal according to the output value of the bridge circuit 832. By feeding the feedback signals to the integrator 802, the audio amplifier therefore has a self-regulating function and so that the output Vout tends to be stable.

Figure 10:
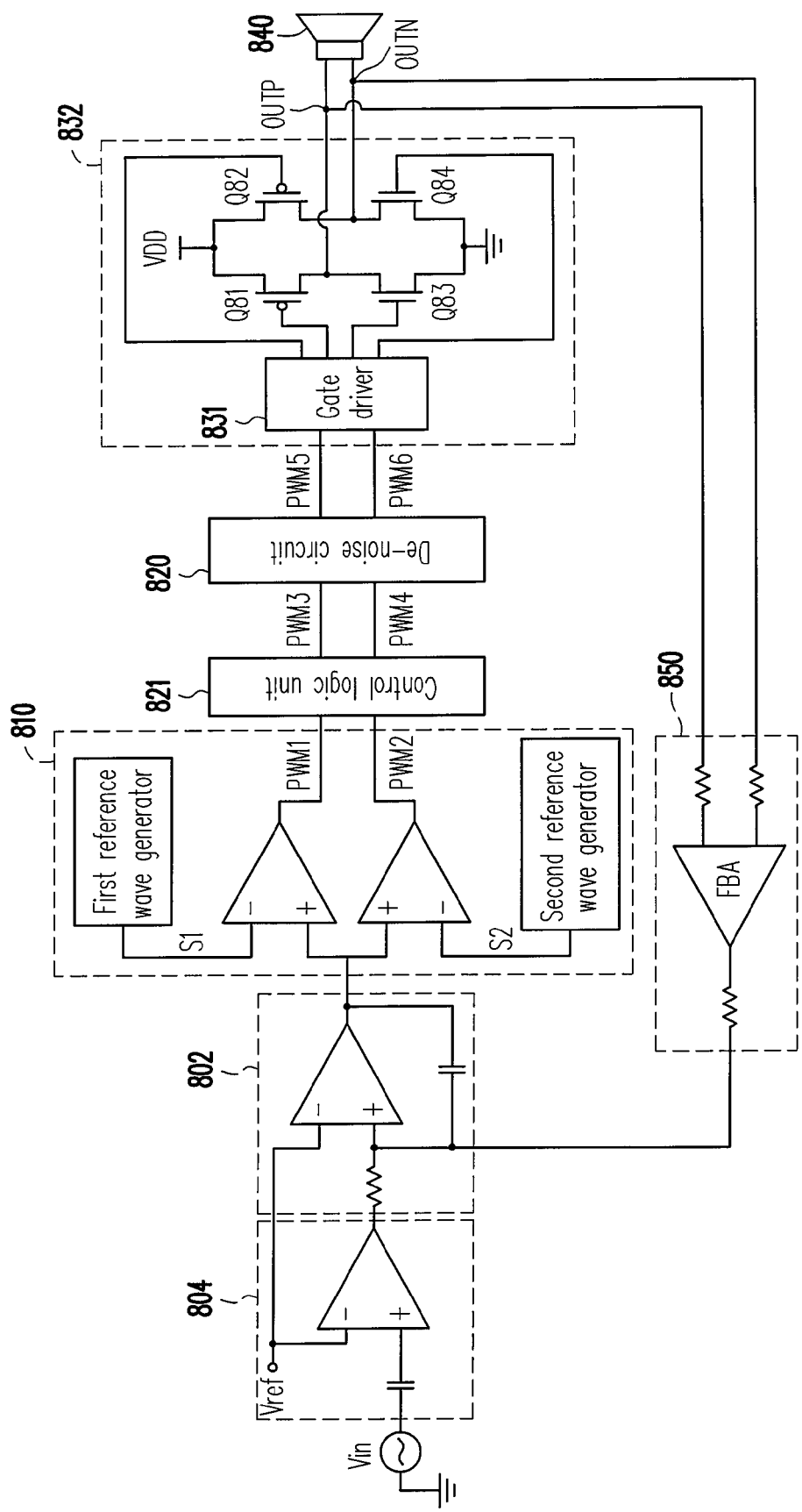
FIG. 10 is a circuit diagram of a switching audio power amplifier according to the second embodiment of the present invention.

Next, the circuit diagram of the switching audio power amplifier is described with more details with reference to FIG. 10. The input amplifier 804, the integrator 802, the pulse width modulator 810 and the feedback circuit 850 in FIG. 10 may be implemented with reference to the input amplifier 304, the integrator 302, the pulse width modulator 310 and the feedback circuit 350 of the previous embodiment, the detail description thereof will not be repeated. The bridge circuit 832 includes the gate driver 831, the first switch, the second switch, the third switch and the fourth switch. The gate driver 831 drives the first~fourth switches according the received PWM signals PWM5 and PWM6. In the present embodiment, the first switch and the second switch for example are implemented with PMOS transistors Q81 and Q82, and the third and the fourth switch may be implemented with NMOS transistors Q83 and Q84.

The transistor Q81 and the transistor Q84 determine the ON/OFF state according to the fifth PWM signal PWM5. The transistor Q82 and the transistor Q83 determine the ON/OFF state according to the sixth PWM signal PWM6. For example, when the fifth PWM signal PWM5 and the sixth PWM signal PWM6 are both logic low potential, the transistors Q81~Q84 are all turned off. When the fifth PWM signal PWM5 is at a logic high potential, while the sixth PWM signal PWM6 is at a logic low potential, the gate driver 831 turns the transistors Q81 and Q84 ON and turns the transistors Q82 and Q83 OFF. Therefore the load 840 acquires a working current of positive direction. When the fifth PWM signal PWM5 is at the logic low potential, while the sixth PWM signal PWM6 is at the logic high potential, the gate driver 831 turns the transistors Q81 and Q84 OFF and turns the transistors Q82 and Q83 ON. Therefore the load 840 receives a working current of inverse direction.

Referring to FIG. 9 and FIG. 10, the third PWM signal PWM3 is the result of the logic AND operation of the first PWM signal PWM1 and the second PWM signal PWM2, and the fourth PWM signal PWM4 is the result of logic NOR operation of the first PWM signal PWM1 and the second PWM signal PWM2. Therefore the third PWM signal PWM3 less the fourth PWM signal PWM4 can be used as the driving signal Vout of the load 840.

However, to avoid that the pulse widths of the signals PWM3 and PWM4 are too narrow, which result in uncertain actuation of the bridge circuit 332's turning ON/OFF the transistors, therefore the de-noise circuit 820 may check the pulse widths of the signals PWM3 and PWM4. If the pulse widths of the signal PWM3 and PWM4 are greater than a threshold, at this moment, instead of regulating the pulse widths of the signal PWM3 and the signal PWM4, the de-noise circuit 820 outputs the signal PWM3 and the signal PWM4 as the signals PWM5 and PWM6 to the bridge circuit 832. When the pulse widths of the signals PWM3 (or PWM4) are less than a threshold, the de-noise circuit 820 may increases the pulse widths of the signals PWM3 (or PWM4) to a value greater than a threshold, then outputs the processed signals PWM3 and PWM4 as the signals PWM5 and PWM6 to the bridge circuit 832.

In other words, the de-noise circuit 820 will force each width of the driving signals Vout to be larger than a threshold, that is to append a noise mask ΔTmask at the end of each noise pulse ΔTnoise. To sum up, even in the case that there is no input audio signal, the noise comes with the audio signal Vin can be successfully eliminated by the de-noise circuit 820.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switching audio power amplifier, comprising:
   a pulse width modulator, for generating a first pulse width modulation (PWM) signal and a second PWM signal, each of which comprising a pulse width modulated according to an input audio signal;
   a de-noise circuit, for delaying the second PWM signal to increase a phase difference between the first and second PWM signals when a phase difference is smaller than a threshold; and
   a bridge circuit, having a plurality of switches controlled by the first PWM signal and the delayed second PWM signal to conduct a driving current alternately flowing to and from a load.

2. The switching audio power amplifier as recited in claim 1, wherein the second PWM signal lags the first PWM signal.

3. The switching audio power amplifier as recited in claim 1 further comprising a feedback circuit for generating a feedback signal indicative of a condition of an output of the bridge circuit, wherein the pulse width of each of the first and second PWM signals is further modulated according to the feedback signal.

4. The switching audio power amplifier as recited in claim 1 further comprising:
   an input amplifier, for receiving and amplifying the input audio signal; and
   an integrator, for receiving an amplified input audio signal and the feedback signal to perform an integral operation.

5. The switching audio power amplifier as recited in claim 4, wherein the pulse width modulator comprises:
   a first comparator, for generating the first PWM signal according to a comparison between a first reference signal and an output of the integrator; and
   a second comparator, for generating the second PWM signal according to a comparison between a second reference signal and the output of the integrator.

6. The switching audio power amplifier as recited in claim 5 further comprising a first generator and a second signal generator for providing a first reference signal and a second reference signal.

7. The switching audio power amplifier as recited in claim 5, wherein the input amplifier comprises:
   a capacitor, having a first end for receiving an input audio signal; and
   an operational amplifier, having a positive input end coupled to a second end of the capacitor, a negative input end for receiving a reference voltage, and an output end coupled to the integrator.

8. The switching audio power amplifier as recited in claim 5, wherein the integrator comprises:
   a resistor, having a first end coupled to the input amplifier;
   an operational amplifier, having a positive input end coupled to a second end of the resistor, a negative input end for receiving a reference voltage, and an output end coupled to the first comparator and the second comparator; and
   a capacitor, having a first end coupled to the positive input end of the operational amplifier, and a second end coupled to the output end of the operational amplifier.

9. The switching audio power amplifier as recited in claim 1, wherein the bridge circuit comprises:
   a first switch, having one end coupled to receive a first voltage and another end coupled to a first end of the load, and being turned on and off in response to the first PWM signal;
   a second switch, having one end coupled to receive the first voltage and another end coupled to a second end of the load, and being turned on and off in response to the second PWM signal;
   a third switch, having one end coupled to receive a second voltage and another end coupled to the first end of the load, and being turned on and off in response to the first PWM signal; and
   a fourth switch, having one end coupled to receive the second voltage and another end coupled to the second end of the load, and being turned on and off in response to the second PWM signal.

10. The switching audio power amplifier as recited in claim 9, wherein the first switch and the third switch are P-type transistors, while the second switch and the fourth switch are N-type transistors.

11. The switching audio power amplifier as recited in claim 9, wherein the first voltage comprises a source voltage, and the second voltage comprises a ground voltage.

12. The switching audio power amplifier as recited in claim 3, wherein the feedback unit comprises:
   a first feedback resistor, having a first end coupled to a first end of the load;
   a second feedback resistor, having a first end coupled to a second end of the load;
   an operational amplifier, having a positive input end coupled to a second end of the first feedback resistor, and having a negative input end coupled to a second end of the second feedback resistor; and
   a third feedback resistor, having a first end coupled to an output end of the operational amplifier, and a second end for outputting the feedback signal.

13. The switching audio power amplifier as recited in claim 1, wherein the load comprises a speaker.

* * * * *